United States Patent
Park et al.

(10) Patent No.: US 10,062,513 B2
(45) Date of Patent: Aug. 28, 2018

(54) CAPACITOR COMPONENT

(71) Applicant: SAMSUNG ELECTRO-MECHANICS CO., LTD., Suwon-si, Gyeonggi-do (KR)

(72) Inventors: Heung Kil Park, Suwon-si (KR); Jong Hwan Park, Suwon-si (KR)

(73) Assignee: SAMSUNG ELECTRO-MECHANICS CO., LTD., Suwon-si, Gyeonggi-Do (KR)

(*) Notice: Subject to any disclaimer, the term of this patent is extended or adjusted under 35 U.S.C. 154(b) by 0 days.

(21) Appl. No.: 15/454,480

(22) Filed: Mar. 9, 2017

(65) Prior Publication Data

US 2018/0137980 A1    May 17, 2018

(30) Foreign Application Priority Data

Nov. 17, 2016 (KR) .................. 10-2016-0153549

(51) Int. Cl.
*H01G 4/30* (2006.01)
*H01G 4/012* (2006.01)
*H01G 4/248* (2006.01)
*H03H 1/00* (2006.01)

(52) U.S. Cl.
CPC .............. *H01G 4/30* (2013.01); *H01G 4/012* (2013.01); *H01G 4/248* (2013.01); *H03H 1/00* (2013.01); *H03H 2001/0085* (2013.01)

(58) Field of Classification Search
CPC .......... H01G 4/005; H01G 4/012; H01G 4/12; H01G 4/30; H01G 4/33; H01G 4/0085
See application file for complete search history.

(56) References Cited

U.S. PATENT DOCUMENTS

| 5,099,387 A | * | 3/1992 | Kato | ............... | H01G 4/012 |
| | | | | | 361/321.2 |
| 9,947,474 B2 | * | 4/2018 | Akada | ............... | H01G 4/012 |
| 2004/0184202 A1 | | 9/2004 | Togashi et al. | | |
| 2007/0070577 A1 | * | 3/2007 | Togashi | ............... | H01G 4/012 |
| | | | | | 361/302 |

(Continued)

FOREIGN PATENT DOCUMENTS

| JP | 2004-253425 A | 9/2004 |
| JP | 2008-071811 A | 3/2008 |

(Continued)

*Primary Examiner* — Nguyen Ha
(74) *Attorney, Agent, or Firm* — McDermott Will & Emery LLP

(57) ABSTRACT

A capacitor component includes a body having a first surface, a second surface, a third surface, a fourth surface, a stack structure including a plurality of dielectric layers, and a first internal electrode and a second internal electrode, a first external electrode formed on the first surface and the fourth surface, and a second external electrode formed on the second surface and the fourth surface. The first internal electrode includes a first region and a second region, the first region being connected to the first external electrode by a lead extending to the fourth surface, and the second region being connected to the first external electrode by a lead extending to the first surface. The second internal electrode includes a third region and a fourth region, the fourth region being connected to the second external electrode by a lead extending to the second surface.

12 Claims, 5 Drawing Sheets

(56) References Cited

U.S. PATENT DOCUMENTS

| | | | |
|---|---|---|---|
| 2008/0100988 A1* | 5/2008 | Togashi | H01G 4/232 361/302 |
| 2008/0174934 A1* | 7/2008 | Togashi | H01G 4/012 361/303 |
| 2009/0109596 A1* | 4/2009 | Togashi | H01G 4/232 361/303 |
| 2010/0091427 A1 | 4/2010 | Lee et al. | |
| 2011/0032655 A1 | 2/2011 | Togashi | |
| 2015/0068792 A1* | 3/2015 | Cho | H01G 4/12 174/258 |
| 2015/0213956 A1* | 7/2015 | Choi | H01G 4/30 174/260 |

FOREIGN PATENT DOCUMENTS

| | | |
|---|---|---|
| JP | 4983874 B2 | 7/2012 |
| JP | 2015-026843 A | 2/2015 |
| KR | 10-2006-0008545 A | 1/2006 |
| KR | 10-2010-0040562 A | 4/2010 |

\* cited by examiner

CAPACITOR COMPONENT

CROSS-REFERENCE TO RELATED APPLICATION

This application claims the benefit of priority to Korean Patent Application No. 10-2016-0153549, filed on Nov. 17, 2016 with the Korean Intellectual Property Office, the entire disclosure of which is incorporated herein by reference.

BACKGROUND

1. Technical Field

The present disclosure relates to a capacitor component.

2. Description of Related Art

As a capacitor component, a multilayer ceramic capacitor (MLCC) may be a chip-type condenser mounted on the printed circuit boards of various electronic devices, such as image display devices including liquid crystal displays (LCD), plasma display panels (PDP), and the like, computers, smartphones, and mobile phones, to charge or discharge the MLCC.

Such an MLCC may be used as a component for various types of electronic devices, due to advantages thereof such as compact size, high capacitance, ease of mounting, and the like.

In particular, a power supply device for a central processing unit (CPU) of a computer or the like may cause voltage noise due to a rapid change in a load current when supplying a low level of voltage. An MLCC is widely used in a power supply device to allow a decoupling capacitor to suppress such voltage noise. In the case of an MLCC used as a decoupling capacitor or the like, reducing a level of impedance in a wide frequency band has been attempted.

SUMMARY

An aspect of the present disclosure provides a capacitor component that may effectively control a level of impedance in a wide frequency band, using a plurality of resonant frequencies.

Another aspect of the present disclosure provides a capacitor component having a compact size.

According to an aspect of the present inventive concept, a capacitor component includes: a body having a first surface and a second surface opposing each other, a third surface and a fourth surface opposing each other while connecting the first surface and the second surface, a stack structure including a plurality of dielectric layers, and a first internal electrode and a second internal electrode disposed alternately with at least one of the plurality of dielectric layers interposed therebetween; a first external electrode formed on the first surface and the fourth surface; and a second external electrode formed on the second surface and the fourth surface. The first internal electrode comprises a first region and a second region spaced apart from each other, the first region being connected to the first external electrode by a lead extending to the fourth surface, and the second region being connected to the first external electrode by a lead extending to the first surface, and the second internal electrode comprises a third region and a fourth region spaced apart from each other, the fourth region being connected to the second external electrode by a lead extending to the second surface.

The first region and the second region may be different in size.

The third region and the fourth region may be different in size.

The lead of the first region and a lead of the third region may be disposed adjacent to opposite corners in the fourth surface.

The first region and the third region may overlap each other in a thickness direction of the first internal electrode and the second internal electrode.

The second region and the fourth region may overlap each other in a thickness direction of the first internal electrode and the second internal electrode.

The third region may be connected to the second external electrode by a lead extending to the fourth surface.

The third region may be connected to the second external electrode by another lead extending to the second surface.

The first region may be connected to the first external electrode by another lead extending to the first surface.

The first region and the second region may be disposed on the same level as each other.

The third region and the fourth region may be disposed on the same level as each other.

The third region may not be connected to the first external electrode and the second external electrode.

The first internal electrode may include a fifth region spaced apart from the first region and the second region, the fifth region being connected to the second external electrode by a lead extending to the fourth surface.

A lead of the first region and the lead of the fifth region may be disposed adjacent to corners in the fourth surface.

The first external electrode and the second external electrode may not be formed on the third surface.

BRIEF DESCRIPTION OF THE DRAWINGS

The above and other aspects, features, and advantages of the present disclosure will be more clearly understood from the following detailed description, taken in conjunction with the accompanying drawings, in which.

DETAILED DESCRIPTION

Figure 1:
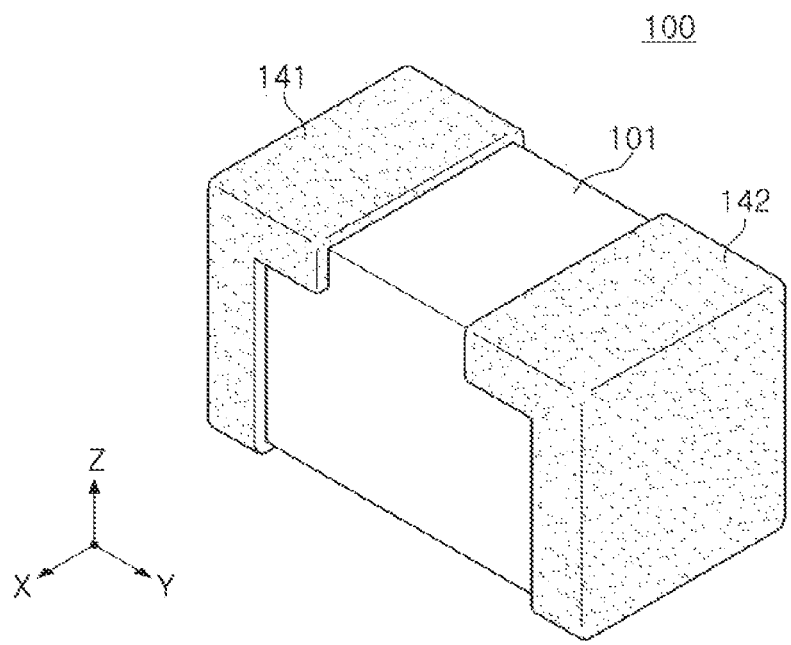
FIG. 1 is a perspective view schematically illustrating a capacitor component according to an embodiment.

Hereinafter, embodiments of the present disclosure will be described as follows with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no other elements or layers intervening therebetween. Like numerals refer to like elements throughout. As used herein, the term "and/or" includes any and all combinations of one or more of the associated listed items.

It will be apparent that although the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship relative to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" relative to other elements would then be oriented "below," or "lower" relative to the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape resulting from manufacturing. The following embodiments may also be constituted alone or as a combination thereof.

The contents of the present disclosure described below may have a variety of configurations and only a required configuration is proposed herein, but the present disclosure is not limited thereto.

Figure 2:
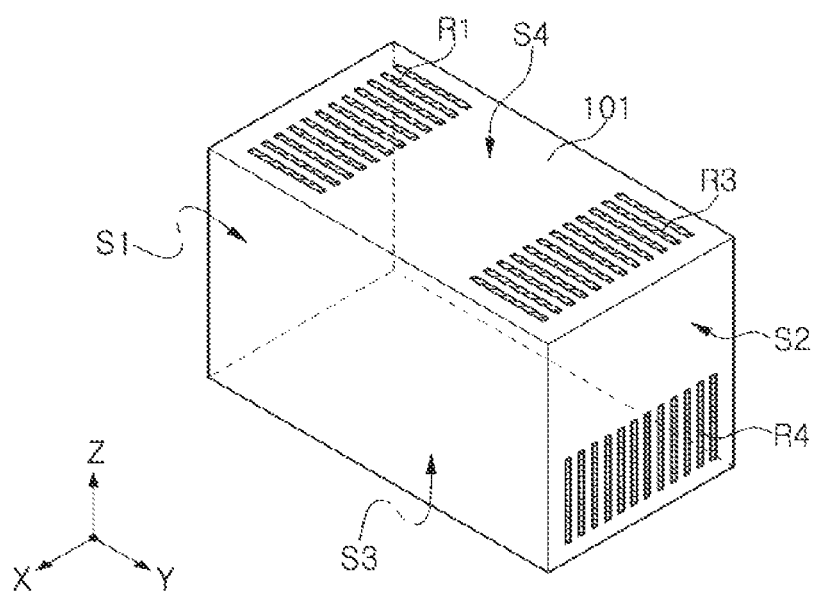
FIG. 2 is a perspective view schematically illustrating the form of a body in the capacitor component of FIG. 1.
Figure 3:
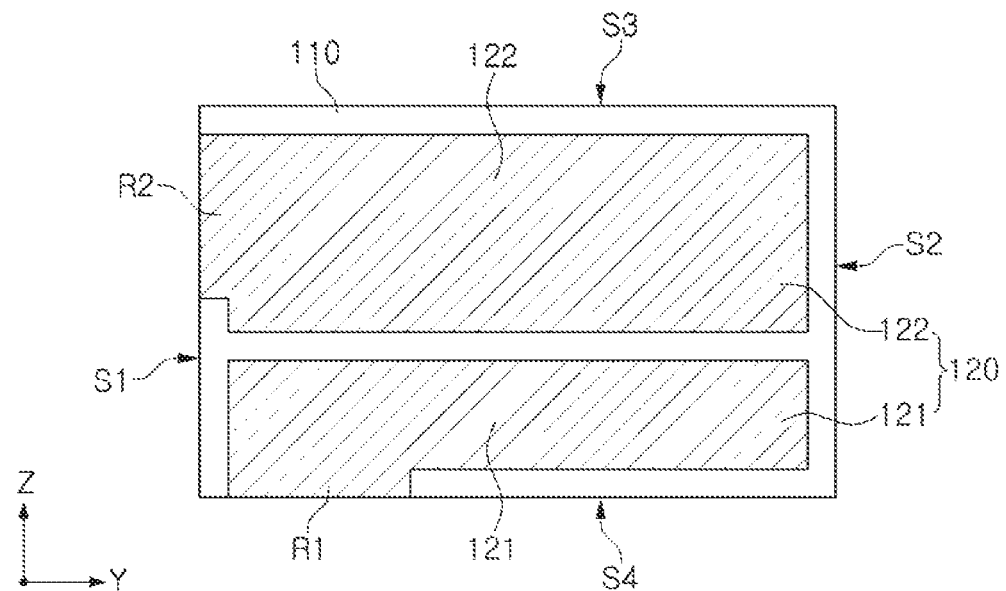
FIGS. 3 and 4 are plan views schematically illustrating the form of a first internal electrode and a second internal electrode in the capacitor component of FIG. 1.
Figure 4:
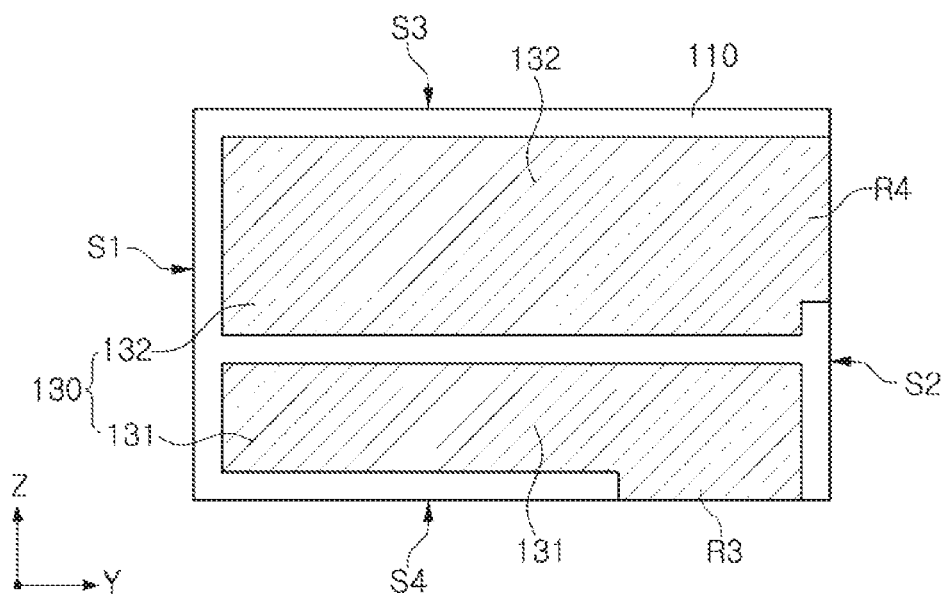
Figure 5:
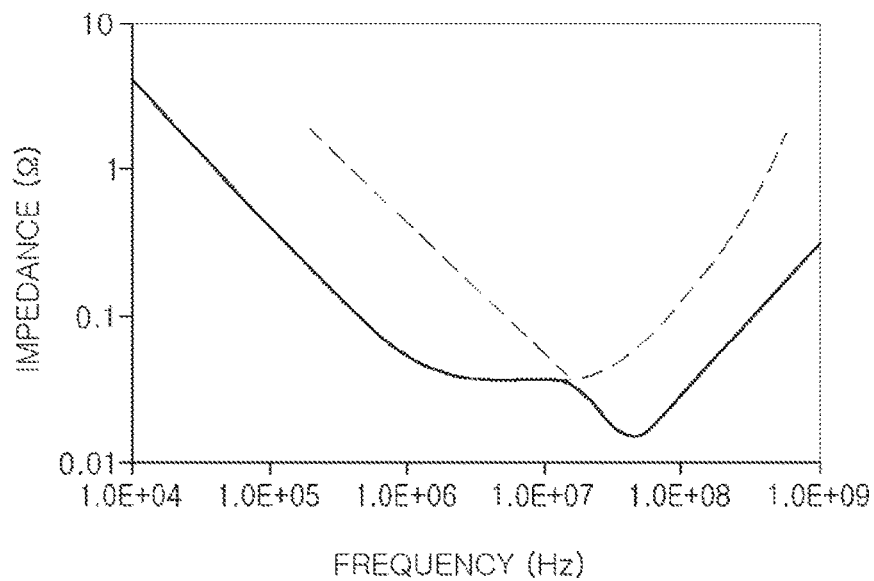
FIG. 5 is a graph illustrating impedance characteristics of a capacitor component obtained according to an embodiment.

FIG. 1 is a perspective view schematically illustrating a capacitor component according to an embodiment. FIG. 2 is a perspective view schematically illustrating the form of a body in the capacitor component of FIG. 1. FIGS. 3 and 4 are plan views schematically illustrating the form of a first internal electrode and a second internal electrode in the capacitor component of FIG. 1. FIG. 5 is a graph illustrating impedance characteristics of a capacitor component obtained according to an embodiment.

Referring to FIGS. 1 through 4, a capacitor component 100 according to an embodiment may include a body 101, a first internal electrode 120 and a second internal electrode 130 included in the body 101, and a first external electrode 141 and a second external electrode 142. In this embodiment, as will be described below, each of the first and second internal electrodes 120 and 130 may be divided into a plurality of regions to generate a plurality of resonant frequencies.

The body 101 may have a first surface S1 and a second surface S2 opposing each other, and a third surface S3 and a fourth surface S4 opposing each other while connecting the first and second surfaces S1 and S2 to each other. In an embodiment, the first and fourth surfaces S1 and S4 may be disposed in a direction perpendicular to each other. Accordingly, the body 101 may have a hexahedral shape or a shape similar thereto. The body 101 may include a stack structure in which a plurality of dielectric layers 110 are stacked, and the first and second internal electrodes 120 and 130 may be alternately disposed with the dielectric layers 110 interposed therebetween. Each of the dielectric layers 110 included in the body 101 may be formed using a dielectric material such as a ceramic known in the related art, and may include, for example, a barium titanate ($BaTiO_3$)-based ceramic powder or the like. Examples of the $BaTiO_3$-based ceramic powder may include $(Ba_{1-x}Ca_x)TiO_3$, $Ba(Ti_{1-y}Ca_y)O_3$, $(Ba_{1-x}Ca_x)(Ti_{1-y}Zr_y)O_3$ or $Ba(Ti_{1-y}Zr_y)O_3$, in which calcium (Ca), zirconium (Zr) or the like is partially dissolved in $BaTiO_3$, but the present disclosure is not limited thereto.

The first external electrode 141 may be formed on the first and fourth surfaces S1 and S4 of the body 101, and may be connected to the first internal electrode 120. The second external electrode 142 may be formed on the second and fourth surfaces S2 and S4 of the body 101, and may be connected to the second internal electrode 130. The capacitor component 100 may be mounted on a substrate, using the fourth surface S4 thereof, but this is not required in an embodiment. In an embodiment, as illustrated in FIG. 1, the first and second external electrodes 141 and 142 may not be formed on the third surface S3.

As illustrated in FIGS. 3 and 4, each of the first and second internal electrodes 120 and 130 may be divided into regions to form capacitances with adjacent internal electrodes having different polarities from those of the first and second internal electrodes 120 and 130. Accordingly, a plurality of resonant frequencies (two resonant frequencies in this embodiment) may be generated, using a single capacitor component 100. In detail, in this embodiment, the first internal electrode 120 may include two regions 121 and 122 spaced apart from each other, and the two regions 121 and 122 may be referred to as a first region 121 and a second region 122, respectively. The first and second regions 121 and 122 may be different in size. In an embodiment, the first and second regions 121 and 122 may be disposed in the dielectric layer 110 on the same level as each other.

In such a manner, the first and second regions 121 and 122 having different sizes may allow different capacitances to be obtained to thus provide a structure of two capacitors connected to each other in parallel, and the first and second regions 121 and 122 may be adjusted in size to control the resonant frequencies. In this embodiment, the sizes of the two regions 121 and 122 may be different from each other, but when a first internal electrode 120 includes three or more regions, at least a portion (two or more regions) thereof may have different sizes from each other. In the same manner, the second internal electrode 130 may include a third region 131 and a fourth region 132. Also, the third and fourth regions 131 and 132 may be disposed in the dielectric layer 110 on the same level as each other.

The first and second internal electrodes 120 and 130 may differ from each other in directions of leads connected to the first and second external electrodes 141 and 142. In detail, as illustrated in FIG. 3, the first region 121 of the first internal electrode 120 may be connected to the first external electrode 141 by a lead R1 extending to the fourth surface S4. Also, the second region 122 may be connected to the first external electrode 141 by a lead R2 extending to the first surface S1. As illustrated in FIG. 4, the third region 131 of the second internal electrode 130 may be connected to the second external electrode 142 by a lead R3 extending to the fourth surface S4, and the fourth region 132 may be connected to the second external electrode 142 by a lead R4 extending to the second surface S2.

Also, the first and third regions 121 and 131 may overlap each other in a thickness direction of the first and second internal electrodes 120 and 130. In the same manner, the second and fourth regions 122 and 132 may overlap each other in the thickness direction of the first and second internal electrodes 120 and 130.

As illustrated in this embodiment, each of the first and second internal electrodes 120 and 130 may be divided into the first and second regions 121 and 122 and the third and fourth regions 131 and 132, respectively, and directions of the leads R1 to R4 connected to the first and second external electrodes 141 and 142 may be properly adjusted to thus provide a structure for effectively connecting two or more capacitors in parallel. In detail, the first and third regions 121 and 131 overlapping each other may have a relatively short current path due to the leads R1 and R3 led out to the fourth surface S4 to thus provide low equivalent series inductance (ESL) characteristics in the capacitor component 100. In an embodiment, the leads R1 and R3 of the first and third regions 121 and 131 may be disposed adjacent to sides of the body 101 opposing each other on the fourth surface S4. The second and fourth regions 122 and 132 overlapping each other may have a relatively long current path due to the leads R2 and R4 led out to the first and second surfaces S1 and S2, respectively, to thus provide high ESL characteristics in the capacitor component 100. Accordingly, the capacitor component 100 including the first and second internal electrodes 120 and 130 may generate two resonant frequencies, and the divided regions 121, 122, 131, and 132 of the first and second internal electrodes 120 and 130 may be adjusted in area to thus effectively control the two resonant frequencies.

In other words, as illustrated in a graph of FIG. 5 regarding impedance characteristics, the capacitor component 100 according to this embodiment may have a structure in which two types of capacitor having different resonant frequencies are included in a single component to thus maintain a low level of impedance across a wide frequency band. Therefore, the use of the capacitor component 100 may reduce the number of decoupling capacitors used in a power supply or a high-speed microprocessor unit (MPU), and may effectively decrease mounting costs or space requirements of decoupling capacitors.

Figure 6:
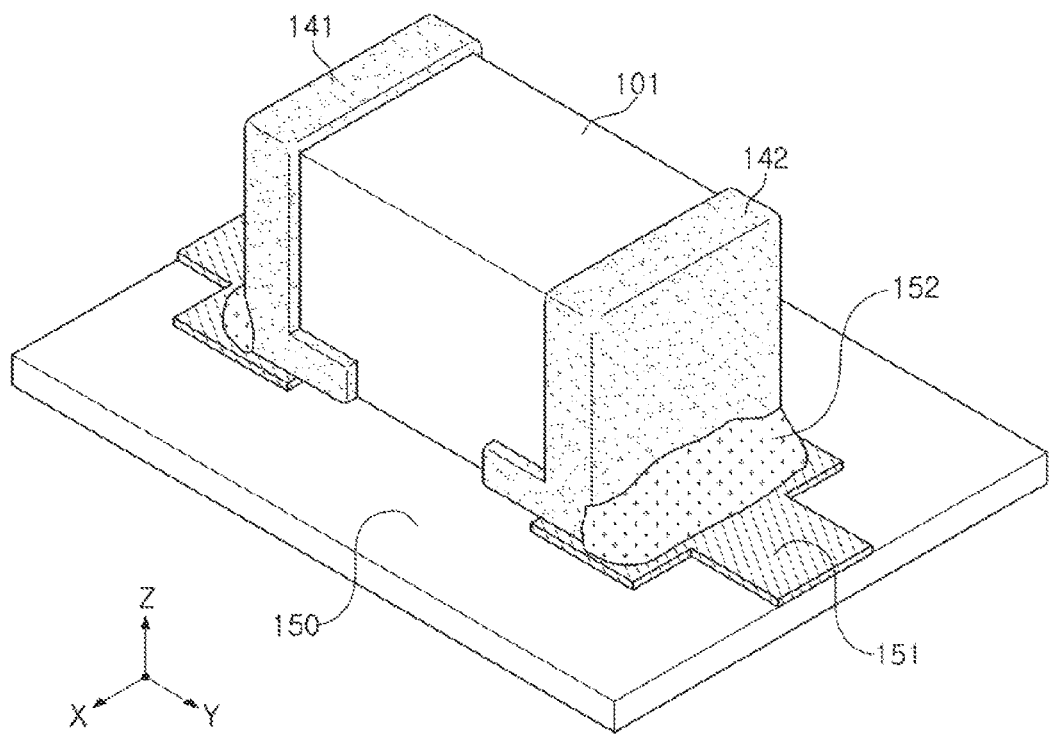
FIG. 6 is a capacitor component according to an embodiment mounted on a substrate.

FIG. 6 illustrates a capacitor component according to an embodiment mounted on a substrate. A mounting structure of FIG. 6 illustrates the capacitor component 100 of FIG. 1 mounted therein, and a capacitor component according to another embodiment to be described later may also be mounted in the same manner as that of FIG. 6. To describe a mounting manner of the capacitor component 100 according to this embodiment, a circuit pattern 151 may be formed on a substrate 150, and a solder 152 may be provided to mount the capacitor component 100. In an embodiment, the capacitor component 100 may be disposed in a vertical mounting manner, for example, a manner in which the first and second internal electrodes 120 and 130 of FIGS. 3 and 4 are disposed in a direction perpendicular to a mounting surface (a surface parallel to the fourth surface S4). The vertical mounting manner may allow the leads R1 to R4 of the first and second internal electrodes 120 and 130 to be disposed close to the mounting surface to thus reduce levels of ESL and impedance of the capacitor component 100.

FIGS. 7 through 10 are plan views of an internal electrode employed in a capacitor component according to modified versions of FIG. 1. FIG. 11 is a schematic circuit diagram using a capacitor component according to a modified version of FIG. 1.

Figure 7:
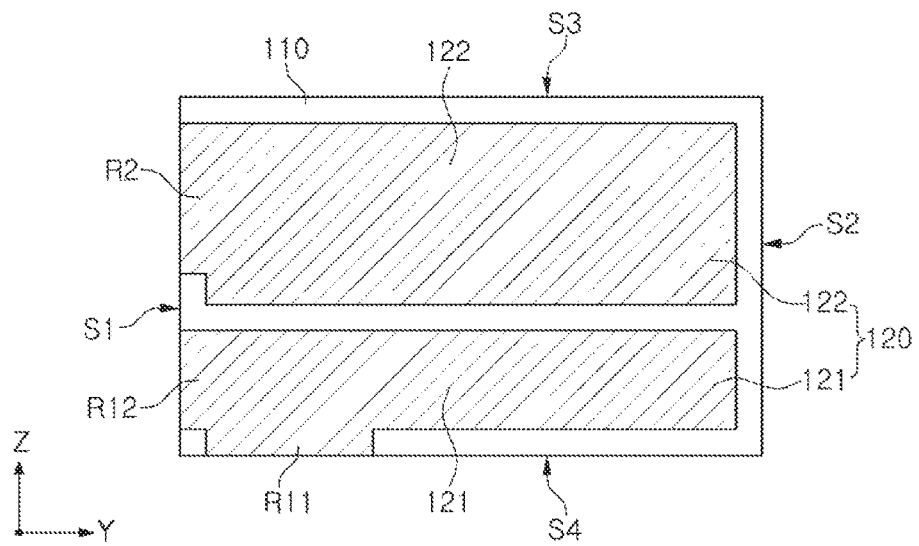
FIGS. 7 through 10 are plan views of an internal electrode employed in a capacitor component according to modified versions of FIG. 1.
Figure 8:
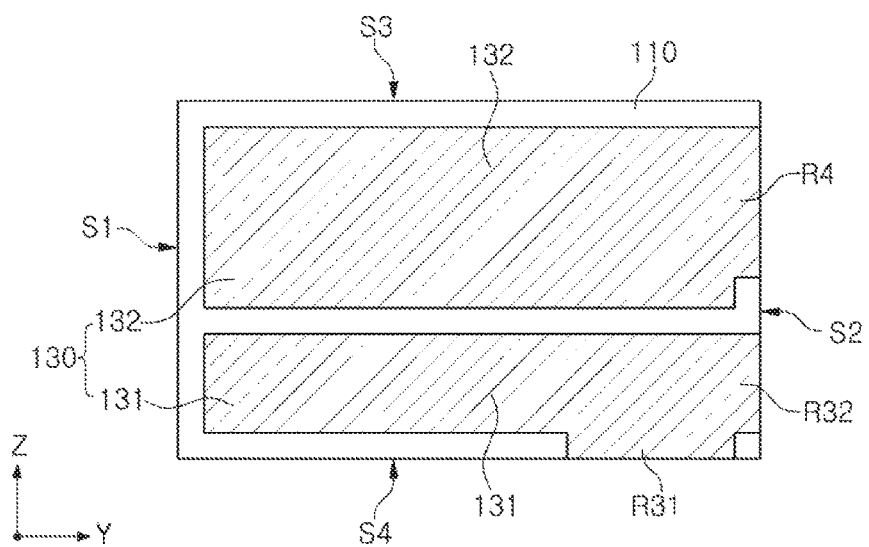

In an embodiment of FIGS. 7 and 8, the first and third regions 121 and 131 may have additional leads R12 and R32, and a structure other than the additional leads R12 and R32 may be equal to that of the above-mentioned embodiment. As illustrated in FIG. 7, the first region 121 may include the additional lead R12 extending to the first surface S1 in addition to a lead R11 extending to the fourth surface S4, and the additional lead R12 may be connected to the first external electrode 141. Also, as illustrated in FIG. 8, the third region 131 may include the additional lead R32 extending to the second surface S2 in addition to a lead R31 extending to the fourth surface S4, and the additional lead R32 may be connected to the second external electrode 142. As illustrated in this embodiment, the first region 121 may be connected to the first external electrode 141 by the two leads R11 and R12, and the third region 131 may be connected to the second external electrode 142 by the two leads R31 and R32, to thus further reduce a level of ESL of the capacitor component 100.

Figure 9:
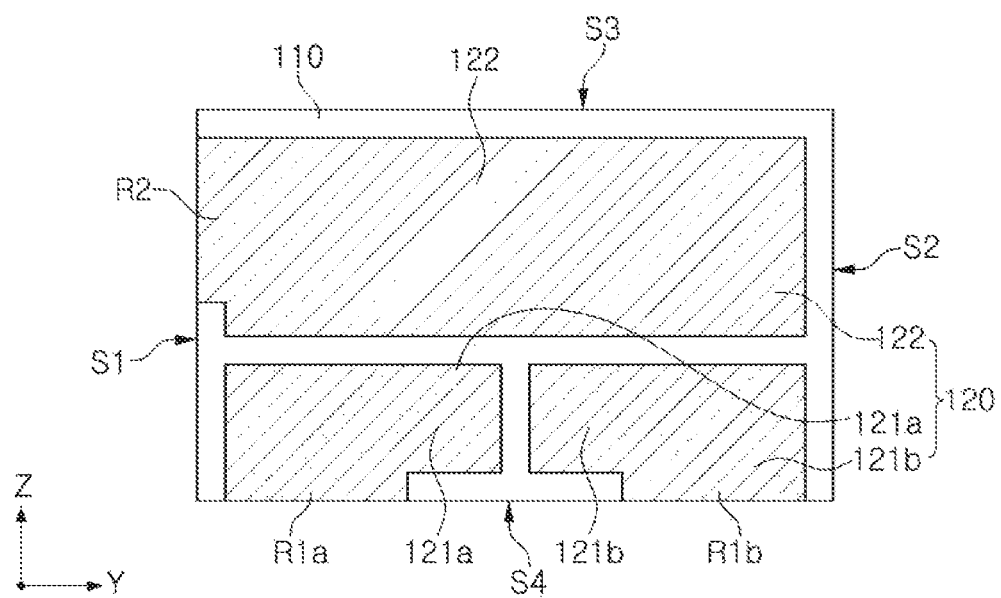
Figure 10:
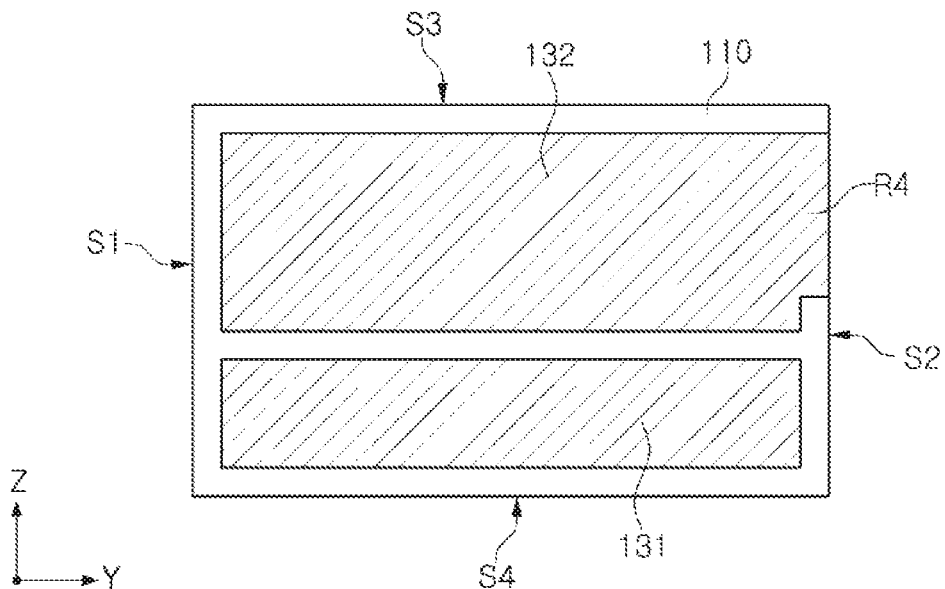
Figure 11:
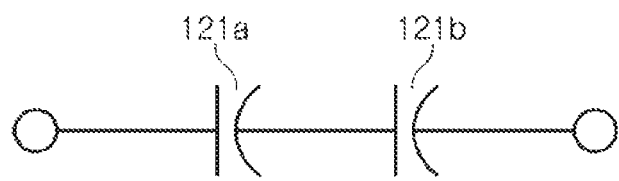
FIG. 11 is a schematic circuit diagram using a capacitor component according to a modified example of FIG. 1.

As illustrated in FIGS. 9 and 10, a region of the first and second internal electrodes 120 and 130 may have a serial capacitor connection structure. In detail, as illustrated in FIG. 9, the first internal electrode 120 may include a fifth region 121b spaced apart from a first region 121a and the second region 122 in addition to the first and second regions 121a and 122. The fifth region 121b may be connected to the second external electrode 142 rather than the first external electrode 141 by a lead R1b extending to the fourth surface S4. In this embodiment, a lead R1a and the lead R1b of the first and fifth regions 121a and 121b may be disposed adjacent to sides of the body 101 opposing each other on the fourth surface S4. As illustrated in FIG. 10, the third region 131 needs not be connected to the first and second external electrodes 141 and 142, and in this embodiment, the third region 131 needs not have a lead. The first and second internal electrodes 120 and 130 may have the above-mentioned structure, and thus, as illustrated in the schematic circuit diagram of FIG. 11, the first region 121a, the third region 131, and the fifth region 121b may allow a serial connection structure of two capacitors to be obtained. As described above, a plurality of capacitors connected to each other in series may be effective in reducing a level of capacitance.

As set forth above, according to an embodiment, an impedance reduced capacitor component that may effectively remove noise in a wide frequency band may be provided. While various advantages and beneficial effects of the present inventive concept are not limited to the foregoing, it will be readily understood in the course of describing the specific embodiments of the present inventive concept.

While exemplary embodiments have been shown and described above, it will be apparent to those skilled in the art that modifications and variations could be made without departing from the scope of the present invention, as defined by the appended claims.

What is claimed is:

1. A capacitor component comprising:
a body having a first surface and a second surface opposing each other, a third surface and a fourth surface opposing each other while connecting the first surface and the second surface, a stack structure including a plurality of dielectric layers, and a first internal electrode and a second internal electrode disposed alternately with at least one of the plurality of dielectric layers interposed therebetween;
a first external electrode formed on the first surface and the fourth surface; and
a second external electrode formed on the second surface and the fourth surface,
wherein the first internal electrode comprises a first region and a second region spaced apart from each other, the first region being connected to the first external electrode by a lead extending to the fourth surface, and the second region being connected to the first external electrode by a lead extending to the first surface,
wherein the second internal electrode comprises a third region and a fourth region spaced apart from each other, the fourth region being connected to the second external electrode by a lead extending to the second surface, and
wherein the second region and the fourth region overlap each other in a thickness direction of the first internal electrode and the second internal electrode.

2. The capacitor component of claim 1, wherein the first region and the second region are different in size.

3. The capacitor component of claim 1, wherein the third region and the fourth region are different in size.

4. The capacitor component of claim 1, wherein the lead of the first region and a lead of the third region are disposed adjacent to opposite corners in the fourth surface.

5. The capacitor component of claim 1, wherein the first region and the third region overlap each other in a thickness direction of the first internal electrode and the second internal electrode.

6. The capacitor component of claim 1, wherein the first region and the second region are disposed on the same level as each other.

7. The capacitor component of claim 1, wherein the third region and the fourth region are disposed on the same level as each other.

8. The capacitor component of claim 1, wherein the third region is not connected to the first external electrode or the second external electrode.

9. A capacitor component comprising:
a body having a first surface and a second surface opposing each other, a third surface and a fourth surface opposing each other while connecting the first surface and the second surface, a stack structure including a plurality of dielectric layers, and a first internal electrode and a second internal electrode disposed alternately with at least one of the plurality of dielectric layers interposed therebetween;
a first external electrode formed on the first surface and the fourth surface; and
a second external electrode formed on the second surface and the fourth surface,
wherein the first internal electrode comprises a first region and a second region spaced apart from each other, the first region being connected to the first external electrode by a lead extending to the fourth surface, and the second region being connected to the first external electrode by a lead extending to the first surface,
wherein the second internal electrode comprises a third region and a fourth region spaced apart from each other, the fourth region being connected to the second external electrode by a lead extending to the second surface,
wherein the third region is connected to the second external electrode by a lead extending to the fourth surface, and
wherein the third region is connected to the second external electrode by another lead extending to the second surface.

10. A capacitor component comprising:
a body having a first surface and a second surface opposing each other, a third surface and a fourth surface opposing each other while connecting the first surface and the second surface, a stack structure including a plurality of dielectric layers, and a first internal electrode and a second internal electrode disposed alternately with at least one of the plurality of dielectric layers interposed therebetween;
a first external electrode formed on the first surface and the fourth surface; and
a second external electrode formed on the second surface and the fourth surface,
wherein the first internal electrode comprises a first region and a second region spaced apart from each other, the first region being connected to the first external electrode by a lead extending to the fourth surface, and the second region being connected to the first external electrode by a lead extending to the first surface,
wherein the second internal electrode comprises a third region and a fourth region spaced apart from each other, the fourth region being connected to the second external electrode by a lead extending to the second surface, and
wherein the first region is connected to the first external electrode by another lead extending to the first surface.

11. A capacitor component comprising:
a body having a first surface and a second surface opposing each other, a third surface and a fourth surface opposing each other while connecting the first surface and the second surface, a stack structure including a plurality of dielectric layers, and a first internal electrode and a second internal electrode disposed alternately with at least one of the plurality of dielectric layers interposed therebetween;
a first external electrode formed on the first surface and the fourth surface; and
a second external electrode formed on the second surface and the fourth surface,
wherein the first internal electrode comprises a first region and a second region spaced apart from each other, the first region being connected to the first external electrode by a lead extending to the fourth surface, and the second region being connected to the first external electrode by a lead extending to the first surface, wherein the second internal electrode comprises a third region and a fourth region spaced apart from each other, the fourth region being connected to the second external electrode by a lead extending to the second surface, wherein the third region is not connected to the first external electrode or the second external electrode, and wherein the first internal electrode comprises a fifth region spaced apart from the first region and the second region, the fifth region being connected to the second external electrode by a lead extending to the fourth surface.

12. The capacitor component of claim 11, wherein a lead of the first region and the lead of the fifth region are disposed adjacent to opposite corners in the fourth surface.

* * * * *